United States Patent
Hiraide

(10) Patent No.: US 8,644,093 B2
(45) Date of Patent: Feb. 4, 2014

(54) WRITING CIRCUIT, SEMICONDUCTOR INTEGRATED CIRCUIT AND WRITING METHOD

(75) Inventor: Takahisa Hiraide, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 96 days.

(21) Appl. No.: 13/465,096

(22) Filed: May 7, 2012

(65) Prior Publication Data

US 2013/0039114 A1    Feb. 14, 2013

(30) Foreign Application Priority Data

Aug. 9, 2011    (JP) .................................. 2011-174318

(51) Int. Cl.
    *G11C 7/06*      (2006.01)
    *G11C 7/22*      (2006.01)
    *G11C 17/00*      (2006.01)

(52) U.S. Cl.
    USPC ...... 365/189.07; 365/94; 365/96; 365/189.16

(58) Field of Classification Search
    USPC .................................................. 365/189.07
    See application file for complete search history.

(56) References Cited

U.S. PATENT DOCUMENTS

| | | | |
|---|---|---|---|
| 6,707,696 | B1 * | 3/2004 | Turner et al. ..................... 365/96 |
| 7,085,158 | B2 * | 8/2006 | Jeon et al. ................ 365/185.04 |
| 2007/0007621 | A1 | 1/2007 | Omura et al. |

FOREIGN PATENT DOCUMENTS

JP    2006-310829    11/2006

* cited by examiner

*Primary Examiner* — Son Mai
(74) *Attorney, Agent, or Firm* — Fujitsu Patent Center

(57) ABSTRACT

A writing circuit includes storage to store writing data to be written to an OTP macro; a controller to apply a first signal that causes the OTP macro to execute writing of the writing data, and apply a second signal that causes the OTP macro to execute reading of data the OTP macro stores; and a comparator to compare the data read from the OTP macro in response to the second signal with the data stored in the storage and output a comparison result, wherein the controller ends a process associated with the writing data if the comparison result indicates a match, and applies the first and second signals again if the comparison result indicates a mismatch.

7 Claims, 11 Drawing Sheets

FIG.8

| St[1:0] | STATUS | Next St[1:0] | | Read | Write/PGM | FF_CLK | CNT_RST | CNT_CLK | Mode | END | Cmp |
|---|---|---|---|---|---|---|---|---|---|---|---|
| s00 | set | If(MD=0) | s00 | 0 | 0 | P | 0 | 0 | 0 | 0 | - |
|  |  | else | s01 | 0 | 0 | 0 | P | 0 | 1 | 0 | - |
| s01 | read |  | s10 | P | 0 | 0 | 0 | 0 | 1 | 0 | - |
| s10 | write | If(Cmp=0) | s11 | 0 | 0 | 0 | 0 | 0 | 1 | 1 | 0 |
|  |  | elseif(Max=1) | s11 | 0 | 0 | 0 | 0 | 0 | 1 | 1 | 1 |
|  |  | else | s01 | 0 | P | 0 | 0 | P | 0 | 0 | - |
| s11 | end |  | s11 | 0 | 0 | 0 | 0 | 0 | 0 | 1 | Cmp |

WRITING CIRCUIT, SEMICONDUCTOR INTEGRATED CIRCUIT AND WRITING METHOD

CROSS-REFERENCE TO RELATED APPLICATIONS

The present application is based upon and claims the benefit of priority of the prior Japanese Application No. 2011-174318, filed on Aug. 9, 2011, the entire contents of which are incorporated hereby by reference.

FIELD

The embodiments discussed herein are related to a writing circuit, a semiconductor integrated circuit and a writing method.

BACKGROUND

Japanese Laid-open Patent Publication No. 2006-310829 discloses related art.

An OTP (One-time Programmable) memory is a kind of nonvolatile memory in which stored information is held even if power is turned off. The OTP memory basically has a capability of one time writing. Here, an antifuse (oxide film breakdown) OTP memory is considered.

FIG. 1 is a diagram for illustrating a principle of the antifuse OTP memory. In FIG. 1, a transistor (MOSFET: Metal-Oxide-Semiconductor Field-Effect Transistor) associated with a memory cell is illustrated. At the time of writing to the OTP memory, a high voltage beyond a voltage rating is applied between a gate Vg and a drain Vd, for example. As a result of this, a part of an oxide film in the gate Vg is broken or damaged and thus a power supply-current characteristic of the transistor is changed. At the time of reading from the OTP memory, it is determined whether the stored value is "0" or "1" based on the power supply-current characteristic of the transistor. Normally, "0" corresponds to a status before the breakout of the oxide film and "1" corresponds to a status after the breakout of the oxide film.

In general, an apparatus referred to as an LSI tester is used for writing to the OTP memory embedded in an LSI (Large Scale Integration). The LSI tester detects manufacturing defects such as open circuits or short circuits in wirings of the LSI at a manufacturing stage of the LSI. Specifically, the LSI tester applies a signal according to a pattern sequence to an external input terminal of the LSI to be tested, and observes a signal value output from an external output terminal of the LSI. If the signal value is different from an expectation value, the manufacturing defect of the LSI is detected.

At the time of writing the data to the OTP memory, the LSI tester applies, to the external input terminal of the OTP memory, a signal according to a pattern sequence for writing to the OTP memory. The pattern sequence for writing to the OTP memory (referred to as "a writing sequence" hereinafter) is such that a high voltage enough to breakdown the oxide film is applied to the transistor as described with reference to FIG. 1. At the time of ascertaining whether the writing is successful or not, the LSI tester applies, to the external input terminal of the OTP memory, a pattern sequence (referred to as "a reading sequence" hereinafter) for reading data from the OTP memory, and observes a signal value output from the external output terminal of the LSI. If the signal value corresponds to an expectation value, the writing is successful.

However, a one time writing sequence of the application does not always lead to a result that the writing is successful. This is because there may be a case where the oxide film is not easily broken-down. Thus, the LSI tester performs the writing to the OTP memory and ascertains whether the writing is successful or not according to a procedure such as illustrated in FIG. 2.

FIG. 2 is a flowchart for explaining an example of a procedure for writing to the OTP memory and ascertaining whether the writing is successful or not.

In FIG. 2, "Program" indicates the application of the signal according to the writing sequence. "READ" indicates the application of the signal according to the reading sequence and comparing the output signal values with the expectation value.

First of all, the Program is executed (S1), and then the READ is executed for the LSI to be tested. If the writing is successful (PASS), the on writing of the data to the OTP memory of the LSI is ended. On the other hand, if the writing ends in failure (FAIL), the Program and the READ are performed again (S3 and S4). For example, in steps S3 and S4, different writing and reading conditions with respect to steps S1 and S2 are adopted. If the writing ends in failure (FAIL), the Program and the READ are performed repeatedly until a maximum number (Max).

Programs which cause the LSI tester to execute the Program and the READ are installed as separate programs. Thus, there is a problem that the LSI tester spends much time for initialization such as loading of the programs according to the Program and the READ at the time of starting the execution of the Program and at the time of starting the execution of the READ.

A cost of usage of the LSI tester is very high, and the cost of usage according to time of usage of the LSI tester is added to the manufacturing cost of the LSI. Thus, shortening the time of usage of the LSI tester is very important for improving profit rate.

SUMMARY

According to an aspect of the embodiment, a writing circuit includes storage to store data to be written in an OTP macro; a controller to apply a first signal that causes the OTP macro to execute writing of the data to be written, and apply a second signal that causes the OTP macro to execute reading of data the OTP macro stores; and a comparator to compare the data read from the OTP macro in response to the second signal with the data stored in the storage and output a comparison result, wherein the controller ends a process associated with the data to be written if the comparison result indicates a match, and applies the first and second signals again if the comparison result indicates a mismatch.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 8 is a diagram for explaining an example of logic of a controlling circuit and a state machine according to a first embodiment.

DESCRIPTION OF EMBODIMENTS

Figure 1:
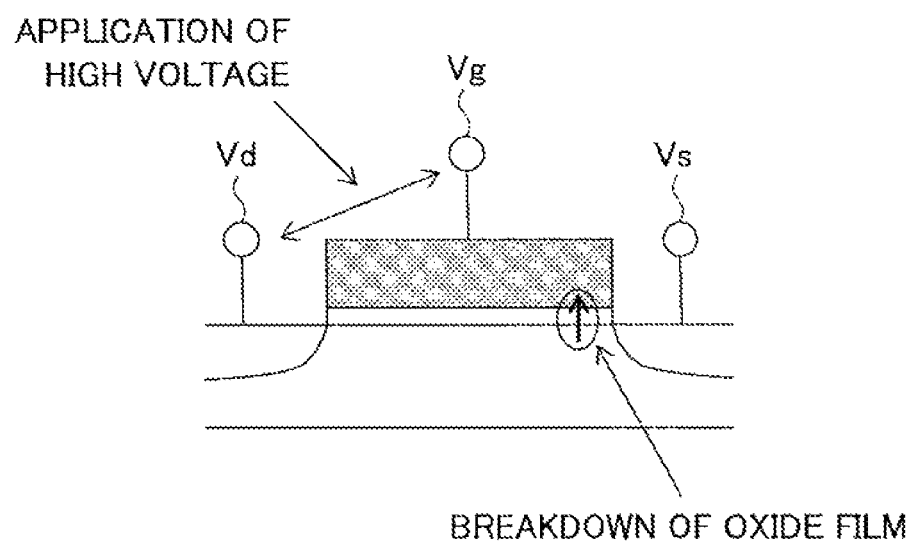
FIG. 1 is a diagram for illustrating a principle of the antifuse OTP memory.
Figure 2:
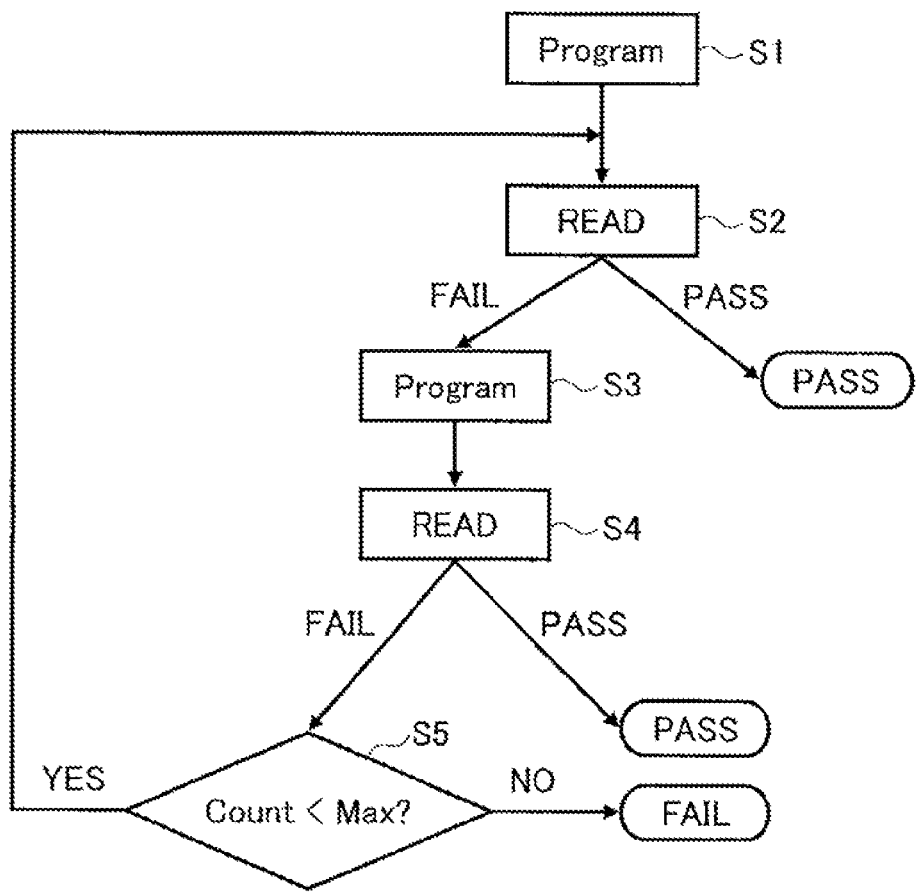
FIG. 2 is a flowchart for explaining an example of a procedure for writing to the OTP memory and ascertaining whether the writing is successful or not.
Figure 3:
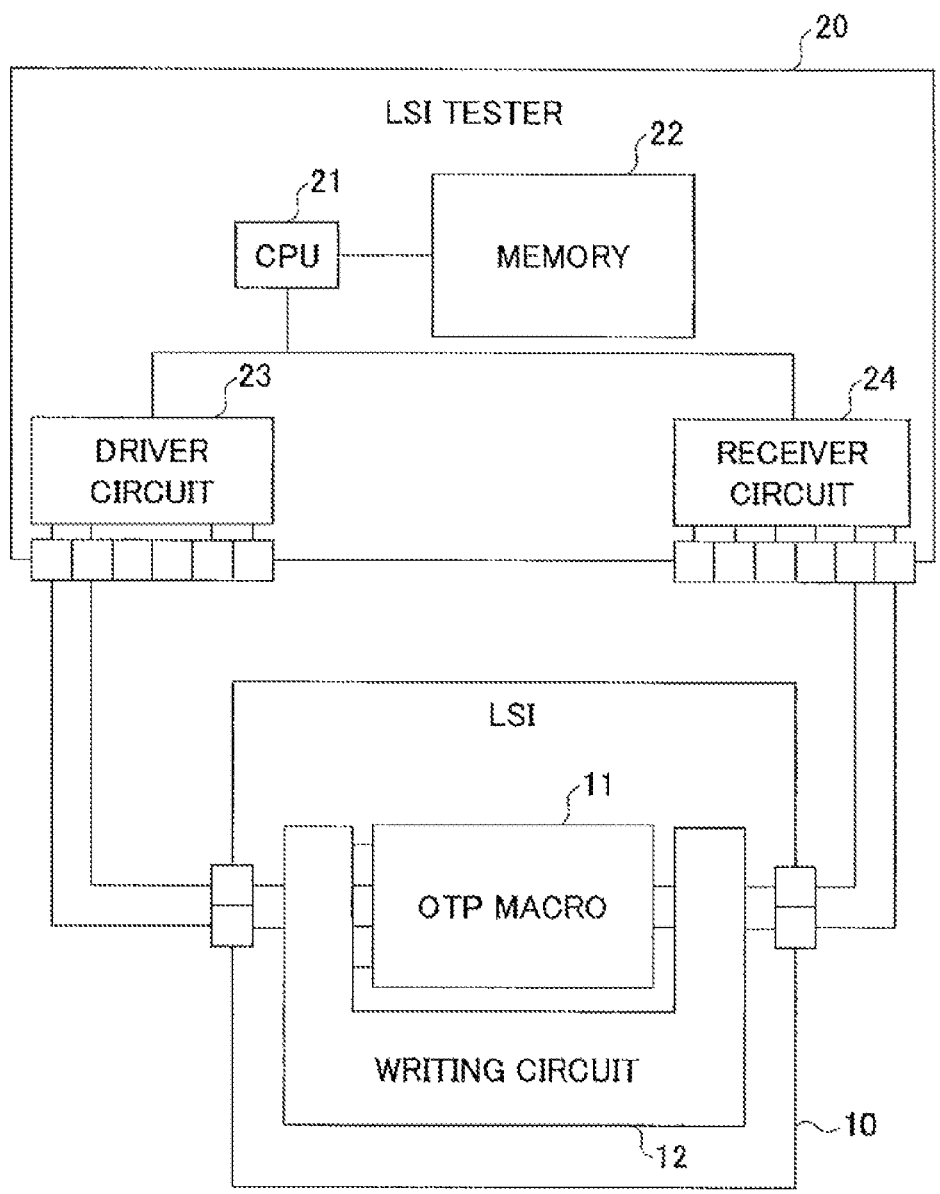
FIG. 3 is a diagram for illustrating an example of a schematic configuration of an LSI and an LSI tester according to an embodiment.

In the following, embodiments of the present invention will be described with reference to the accompanying drawings. FIG. 3 is a diagram for illustrating an example of a schematic configuration of an LSI and an LSI tester according to an embodiment.

In FIG. 3, an LSI (Large Scale Integration) 10 is an example of a semiconductor integrated circuit. The LSI 10 includes an OTP macro 11, a writing circuit 12, etc. The OTP macro 11 is a group of circuits including an antifuse (oxide film (insulation film) breakdown) OTP (One Time Programmable) memory. The writing circuit 12 performs writing of data to the OTP memory and ascertaining whether the writing is successful or not. In other words, the LSI 10 includes a function of writing and a function of ascertaining whether the writing is successful or not, etc., of the OTP macro 11.

An LSI tester 20 is an ordinary LSI tester. The LSI tester 20 includes a CPU 21, a memory 22, a driver circuit 23, a receiver circuit 24, etc. The memory 22 stores a program for a test of the LSI 10 (a test program), etc. In the present embodiment, the test program causes the writing circuit 12 to perform the writing of data with respect to the OTP macro of the LSI 10 and ascertaining whether the writing is successful or not. The CPU 21 executes process control according to the test program. For example, the CPU 21 makes the driver circuit 23 apply a signal to an external input terminal of the LSI 10. The signal is according to a pattern sequence installed in the test program. The CPU 21 determines termination of the pattern sequence based on an output signal value from an external output terminal of the LSI 10 received by the receiver circuit 24. It is noted that in FIG. 3, the driver circuit 23 and the LSI 10 are connected by two lines. The lines are schematic and the number of the lines does not strictly indicate the number of signals input to the LSI 10 from the driver circuit 23. It is true for lines connecting the receiver circuit 24 and the LSI 10.

Figure 4:
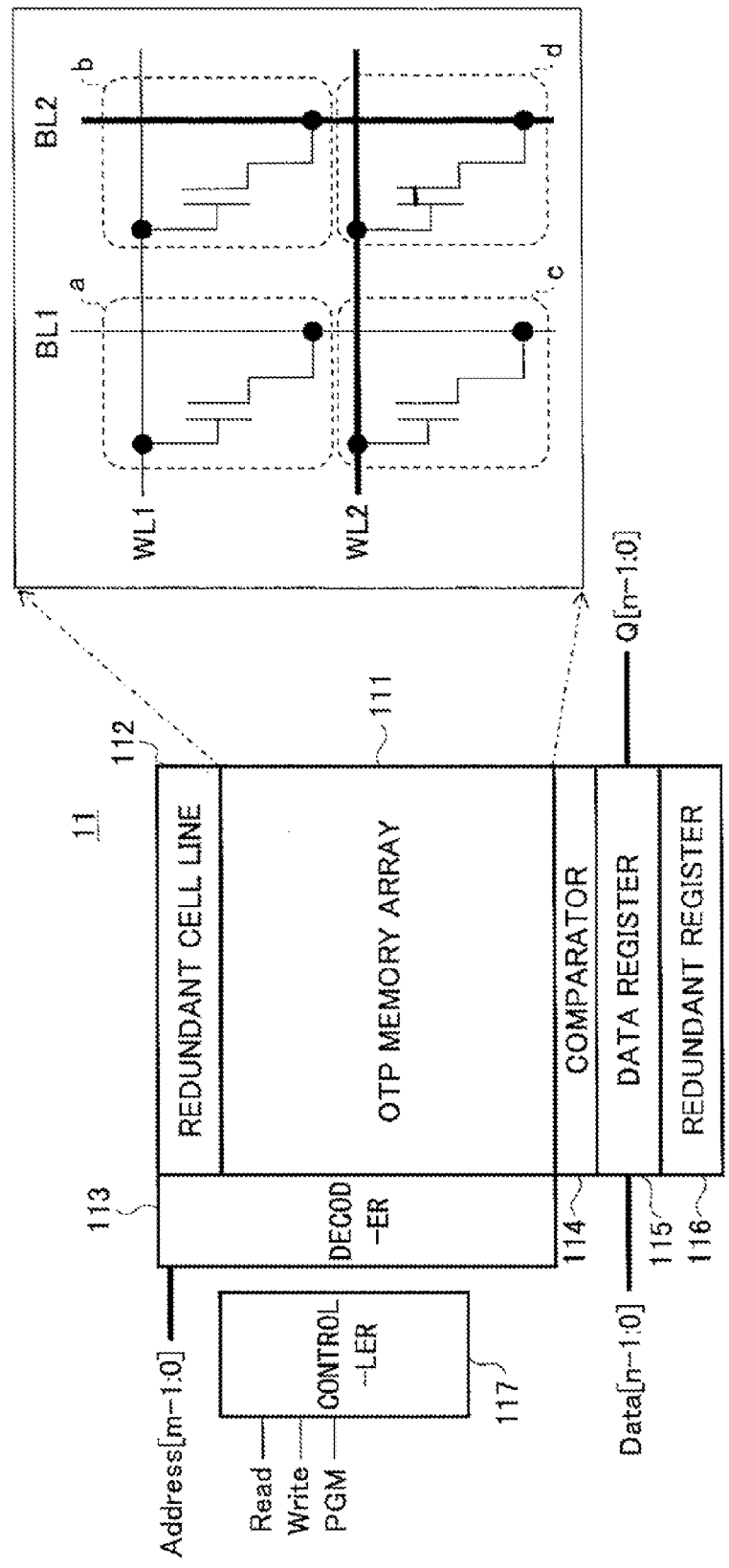
FIG. 4 is a diagram for illustrating an example of a configuration of an OTP macro according to an embodiment.

FIG. 4 is a diagram for illustrating an example of a configuration of an OTP macro according to an embodiment. In FIG. 4, the OTP macro 11 includes an OTP memory array 111, a redundant cell line 112, a decoder 113, a comparator 114, a data register 115, a redundant resistor 116, a controller 117, etc. As illustrated in an enlarged portion on the right side of FIG. 4, the OTP memory array 111 is configured such that more than one OTP memory cell (merely referred to as "memory cells" hereinafter) are arranged in a grid array having more than one line and more than one row. Gates of the respective memory cells (MOSFET: Metal-Oxide-Semiconductor Field-Effect Transistor) are connected to bit selection lines BL and drains of the respective memory cells are connected to word selection lines WL. In the case of writing data to a certain memory cell, a high voltage is applied between a bit selection line BL connecting to the gate of the memory cell and a word selection lines WL connecting to the drain of the memory cell. In FIG. 4 is illustrated a broken-down oxide film of the memory cell d due to the application of the high voltage between the bit selection line BL2 and the word selection line WL2 indicated by wide lines.

The redundant cell line 112 is a group of memory cells which are to be used if a part of the memory cells in the OTP memory array 111 fails.

The decoder 113 is a circuit configured to select the bit selection line BL and the word selection line WL corresponding to an address indicated by an Address signal at the time of writing data to the OTP memory array 111 or reading data from the OTP memory array 111.

The comparator 114 is a circuit configured to determine, at the time of reading data from the OTP memory array 111, whether a value stored in the memory cell to be read from is "1" or "0" based on a characteristic of current output from the OTP memory array 111 and output a determination result. In other words, a conversion from analog to digital is performed by the comparator 114. The data register 115 is a circuit configured to store writing data indicated by a Data signal (a data input signal) applied from the outside of the OTP macro 11 at the time of writing the data, and store data output from the comparator 114 at the time of reading the data. At the time of reading the data, the data stored in the data register 115 is output to the outside of the OTP macro 11. The data register 115 includes one more flip-flop for storing the data, for example.

The redundant resistor 116 is a circuit configured to store information which indicates which memory cell of the redundant cell line 112 replaces which memory cell of the OTP memory array 111 if the memory cell included in redundant cell line 112 is used. It is noted that the redundant cell line 112 and the redundant resistor 116 are circuits for redundancy and thus may not be included in the OTP macro 11.

The controller 117 receives inputs of a Read signal, a Write signal, a PGM signal, etc., on from the outside of the OTP macro 11 and performs control according to the signals. The Read signal indicates an instruction to read the data. The Write signal indicates an instruction to set (write) the writing data to the data resistor 115. The PGM signal is a high voltage signal to be applied between the bit selection line BL and the word selection line WL.

Figure 5:
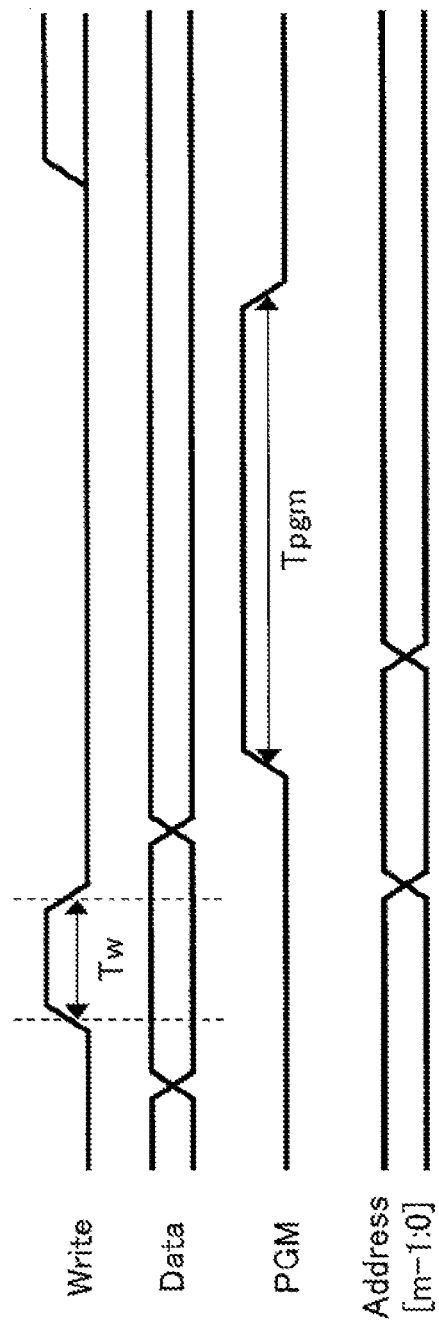
FIG. 5 is a timing chart for explaining a writing operation for data to be written to the OTP macro.

FIG. 5 is a timing chart for explaining a writing operation for data to be written to the OTP macro.

After the Data signal indicates an effective value (i.e., the writing data), if the Write signal is applied for a predetermined period (Tw), the writing data is stored in the data resistor 115. Then, after the Address signal indicates an effective value (i.e., the address to which the writing data is to be written), if the PGM signal is applied for a predetermined period (Tpgm), the decoder 113 applies the voltage of the PGM signal between the bit selection line BL and the selection word lines WL corresponding to the address indicated by the Address signal. As a result of this, the writing data is written to the memory cell corresponding to the address.

Figure 6:
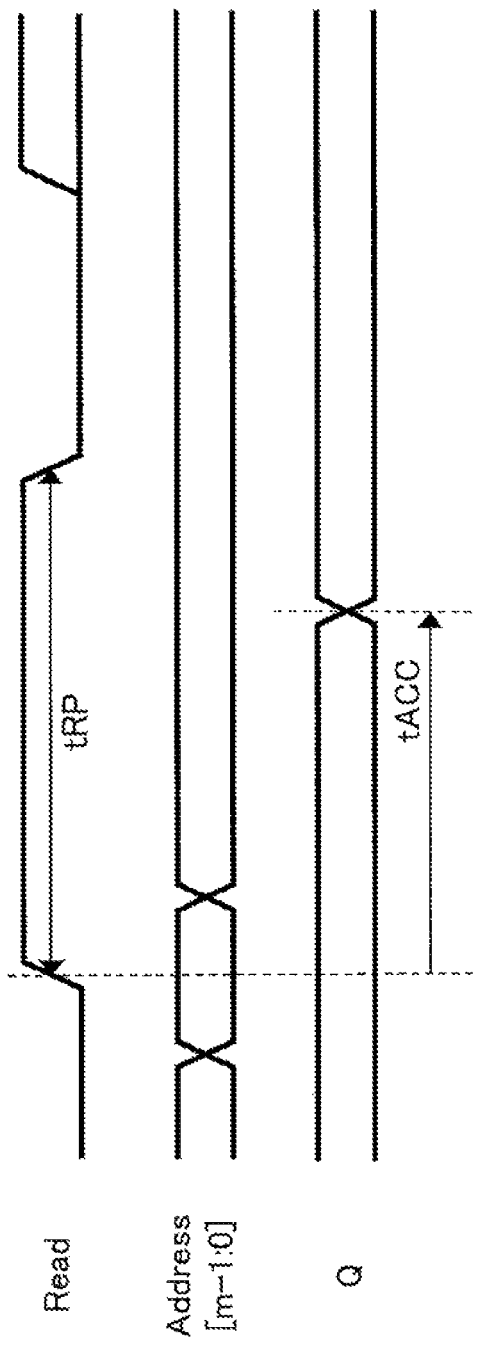
FIG. 6 is a timing chart for explaining a reading operation of data from the OTP macro.

FIG. 6 is a timing chart for explaining a reading operation of data from the OTP macro.

After the Address signal indicates an effective value (i.e., the address from which the data is to be read), if the Read signal is applied for a predetermined period (tRP), the comparator 114 outputs a value ("0" or "1") according to a current characteristic of the memory cell according to the address indicated by the Address signal. The value output from the comparator 114 is stored in the data resistor 115. When a predetermined time (tACC) has passed after the application of the Read signal, a signal Q indicating the data stored in the data resistor 115 is output from the data resistor 115.

Figure 7:
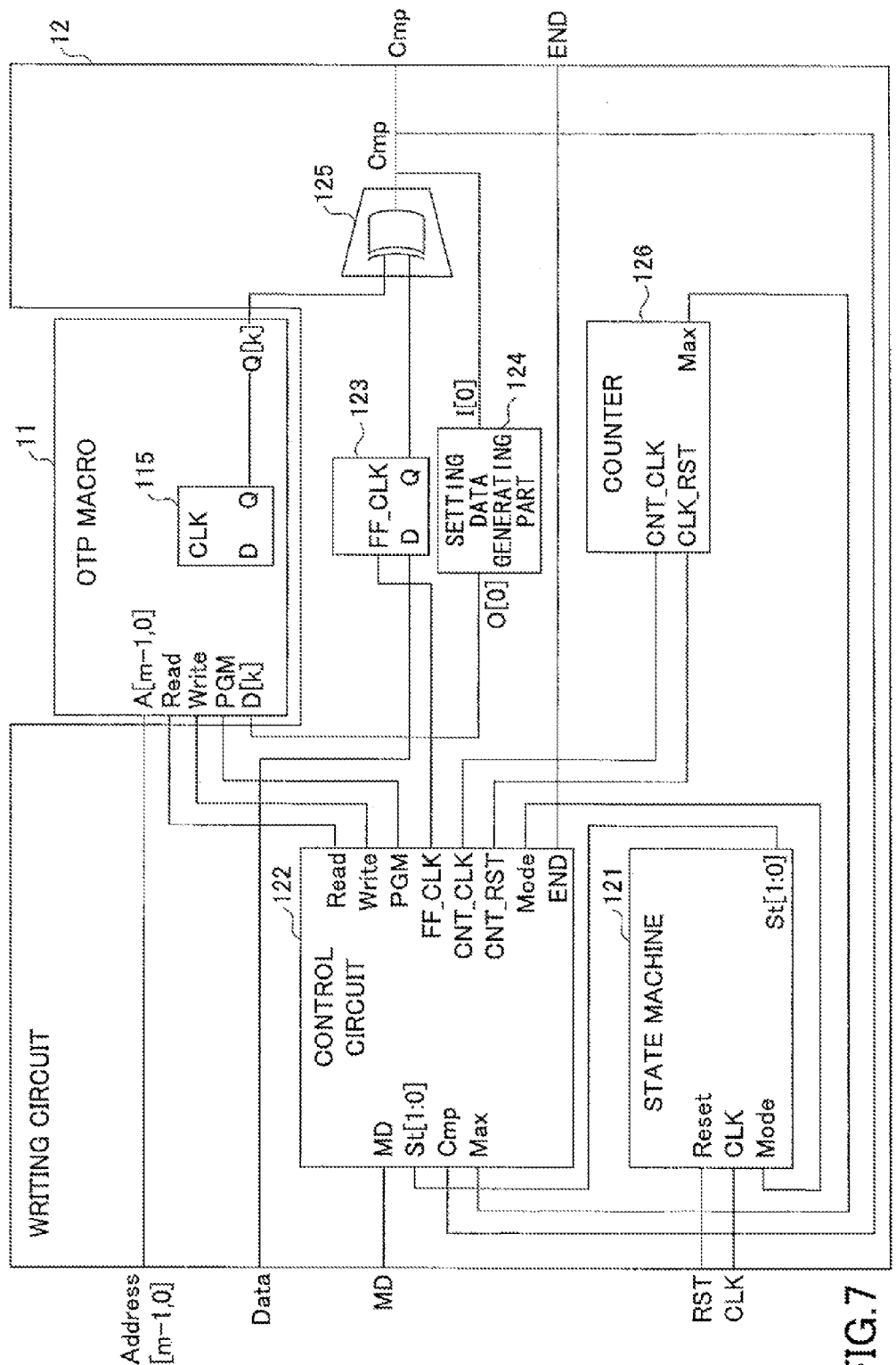
FIG. 7 is a diagram for illustrating an example of a configuration of a writing circuit according to a first embodiment.

FIG. 7 is a diagram for illustrating an example of a configuration of a writing circuit according to a first embodiment. In FIG. 7, the writing circuit 12 includes a state machine 121, a control circuit 122, a comparison data storing part 123, a setting data generating part 124, a comparator 125, a counter 126, etc. It is noted that in the first embodiment, for the sake of convenience, a case is assumed in which the information amount of the writing data (i.e., the number of bits) is 1 bit.

The state machine 121 is a circuit configured to store an operation status of the writing circuit 12. For example, the state machine 121 includes two flip-flops and represents, with the information amount of four bits, four operation statuses such as a set status, a read status, a write status, and an end status. The set status is a status in which the writing data is to be set (stored) in the comparison data storing part 123. The read status is a status in which the data written to the OTP memory array 111 is to be read. The write status is a status in which the writing data stored in the comparison data storing part 123 is to be stored in the data register 115 and the writing data stored in the data register 115 is to be written to the OTP memory array 111. The end status is a status in which one pattern sequence is to be ended.

To the state machine 121 are input a Rest(RST) signal and a clock (CLK) signal from the LSI tester 20 and a Mode signal from the control circuit 122. The stored value of the state machine 121 is initialized (reset) to "00" in response to the input of the RST signal. As described hereinafter, "00" indicates the set status. The state machine 121 outputs the current stored value on to the control circuit 122 in response to the CLK signal. The state machine 121 determines the next operation status to be formed based on the value of the Mode signal and the current operation status (the stored value) and stores the value according to the next operation status. The state machine 121 outputs a St signal which indicates the current stored value (i.e., the operation status) to the control circuit 122.

The comparison data storing part 123 stores the writing data indicated by the Data signal input from the LSI tester 20 if an FF_CLK signal is input in the set status. In the first embodiment, since the information amount of the writing data is 1 bit, the comparison data storing part 123 is a flip-flop, for example. The writing data stored in the comparison data storing part 123 is used to ascertain whether the writing of the writing data to the OTP memory array 111 is successful or not.

The comparator 125 compares, in the read status, the data read from the OTP memory array 111 and stored in the data resistor 115 with the writing data stored in the comparison data storing part 123, and outputs a signal indicating a comparison result. Specifically, the comparator 125 includes an XOR gate. The comparator 125 calculates an exclusive OR between the data read from the OTP memory array 111 and stored in the data resistor 115 with the writing data stored in the comparison data storing part 123, and outputs a Cmp signal indicating a calculation result. Thus, "0" of the Cmp signal indicates a match of the compared data, and "1" indicates a mismatch of the compared data. The Cmp signal is input to the control circuit 122, the setting data generating part 124 and the LSI tester 20.

The setting data generating part 124 is a circuit configured to generate, in the set status, data (referred to as "setting data" hereinafter) to be set (stored) in the data register 115 based on the writing data stored in the comparison data storing part 123. The generated setting data is set in the data register 115 in the writing status. It is noted that, in the first embodiment in which the writing data is 1 bit, the setting data generating part 124 may generate the setting data directly from the writing data stored in the comparison data storing part 123. Further, the setting data generating part 124 adopts the value of the Cmp signal output from the comparator 125 as the setting data in the read status after the first write status.

The counter 126 is a circuit configured to count the number of writings of the writing data to OTP memory array 111. The counter 126 initializes the number of writings to "0" in response to an input of a CNT_RST signal output from the control circuit 122. The counter 126 adds 1 to the number of writings in response to an input of a CNT_RST signal output from the control circuit 122. The counter 126 provides a notification to the control circuit 122 if the number of writings reaches an upper limit. Specifically, the counter 126 makes a value of an outputting Max signal "1". The value of the Max signal is made "0" if the number of writings does not reach an upper limit. It is possible to limit the number of writings of the writing data within a predetermined number using the counter 126, and thus reduce time consumed for the OTP memory array 111 to which the writing of the data (i.e., the breakdown of the oxide film) is difficult.

The control circuit 122 is a circuit configured to perform control according to the operation status, etc., indicated by the state machine 121. The operations of the control circuit 122 are described with reference to FIG. 8.

FIG. 8 is a diagram for explaining an example of logic of a controlling circuit and a state machine according to a first embodiment. In FIG. 8, operation statuses are divided in a line direction, and in a row direction (but after the fourth row) control contents of the control circuit 122 (i.e., the status of the signal output by the control circuit 122) are indicated. With respect to the status of the signal, "P" indicates a pulse (i.e., the application of the signal).

The first row indicates, with two bits, the value of the St signal input to the control circuit 122 from the state machine 121. It is noted that in the present embodiment, a symbol "s" which precedes the value indicates the value of the St signal. The second row indicates which status, among the set status, the read status, the write status and the end status, the respective values of the St signal corresponds to. It is noted that the set status, the read status, the write status and the end status are names given to the respective values of the St signal for the sake of convenience of the explanation. The third row indicates the next operation status to be formed after the control indicated in the fourth and subsequent rows has been executed.

If the value of the St signal input to the control circuit 122 is "s00" (i.e., in the case of the set status), the control circuit 122 applies the FF_CLK signal if the value of the MD signal input from the LSI tester 20 is "0". As the result of this, the writing data indicated by the Data signal is stored in the comparison data storing part 123. Further, the setting data is generated by the setting data generating part 124 based on the writing data stored in the comparison data storing part 123. However, the value of the setting data is the same as the writing data. Further, the control circuit 122 applies the CNT_RST signal and makes the value of the Mode signal "1" if the value of the on Mode signal is other than "0". In response to an input of the CLK signal after the value of the Mode signal is made "1", the state machine 121 changes the stored value to "s01" based on a combination of the value "1" of the Mode signal and the current stored value "s00". Thus, the value of the St signal input to the control circuit 122 is "s01". It is noted that the MD signal is a signal input to the writing circuit 12 from the LSI tester 20 in order to forcefully change the operation status of the writing circuit 12.

If the value of the St signal input to the control circuit 122 is "s01" (i.e., in the case of the read status), the control circuit 122 applies the Read signal and makes the value of the Mode signal "1". As a result of this, the value stored in the memory cell in the OTP memory array 111 corresponding to the address indicated by the Address signal is stored (read) in the data register 115. Further, in response to an input of the CLK signal after the transition to the read status, the state machine 121 changes the stored value to "s10" based on a combination of the value "1" of the Mode signal and the current stored value "s01". Thus, the value of the St signal input to the control circuit 122 is "s10".

Under a situation in which the value of the St signal input to the control circuit 122 is "s10" (i.e., in the case of the write status), if the value of the Cmp signal input from the comparator 125 is "0", the control circuit 122 makes the value of the Mode signal "1" and outputs an end signal. Further, the control circuit 122 makes the value of the Mode signal "1" and outputs the end signal, if the value of the Cmp signal is other than "0" and the value of the Max signal input from the counter 126 is "1".

As a result of this, in response to an input of the CLK signal after the transition to the write status, the state machine 121 changes the stored value to "s11" based on a combination of the value "1" of the Mode signal and the current stored value "s10". Thus, the value of the St signal input to the control circuit 122 is "s11". Further, the end signal is input to the LSI tester 20, and the CPU 21 determines the termination of the pattern sequence (i.e., the termination of writing of the writing data).

Further, under a situation in which the value of the St signal input to the control circuit 122 is "s10", if the value of the Cmp signal input from the comparator 125 is other than "0" and the value of the Max signal input from the counter 126 is "0", the control circuit 122 applies the Write signal and the PGM signal. In response to the application of the Write signal, the setting data generated by the setting data generating part 124 is set in the data register 115. Further, in response to the application of the high voltage PGM signal, writing the writing data set in the data register 115 to the memory cell in the OTP memory array 111 corresponding to the address indicated by the Address signal is performed. In other words, the breakdown of the oxide film related to the corresponding memory cell is performed.

It is noted that in FIG. 8 the Write signal and the PGM signal are unified in a row; however, this indicates that the Write signal and the PGM signal are applied in the write status and does not indicate that the Write signal and the PGM signal are applied simultaneously. As described with reference to FIG. 5, there is a slight difference in timing of the application between the Write signal and the PGM signal.

Further, in the present embodiment, the example in which the high voltage PGM signal is on applied by the control circuit 122; however, the PGM signal may be supplied from the LSI tester 20. In this case, the control circuit 122 applies a control signal, instead of the PGM signal, for controlling whether to apply the PGM signal to the OTP macro 11. Specifically, a signal line by which the PGM signal is supplied from the LSI tester 20 and a signal line by which the control signal is supplied from the control circuit 122 may be connected to an AND gate, and a calculation result of the logical product by the AND gate may be input to the OTP macro. With this arrangement, the control circuit 122 can apply the high voltage PGM signal to the OTP macro 11 by making the value of the control signal "1".

Further, the control circuit 122 applies a CNT_CLK signal in the write status. In response to application of the CNT_CLK signal, the counter 126 adds 1 to the number of writing. Further, the control circuit 122 makes the value of the Mode signal "0". As a result of this, in response to an input of the CLK signal after the transition to the write status, the state machine 121 changes the stored value to "s01" based on a combination of the value "0" of the Mode signal and the current stored value "s10". Thus, the value of the St signal input to the control circuit 122 is "s01". In other words, under a situation in which the value of the St signal input to the control circuit 122 is "s10", if the value of the Cmp signal input from the comparator 125 is other than "0" and the value of the Max signal input from the counter 126 is "0", the applications of the Write signal and the PGM signal and the application of the Read signal are repeated.

If the value of the St signal input to the control circuit 122 is "s11" (i.e., in the case of the end status), the control circuit 122 ends the process associated with the writing data. Specifically, the control circuit 122 applies the END signal. The END signal is input to the LSI tester 20. The LSI tester 20 ends the pattern sequence if the END signal is input.

Figure 9:
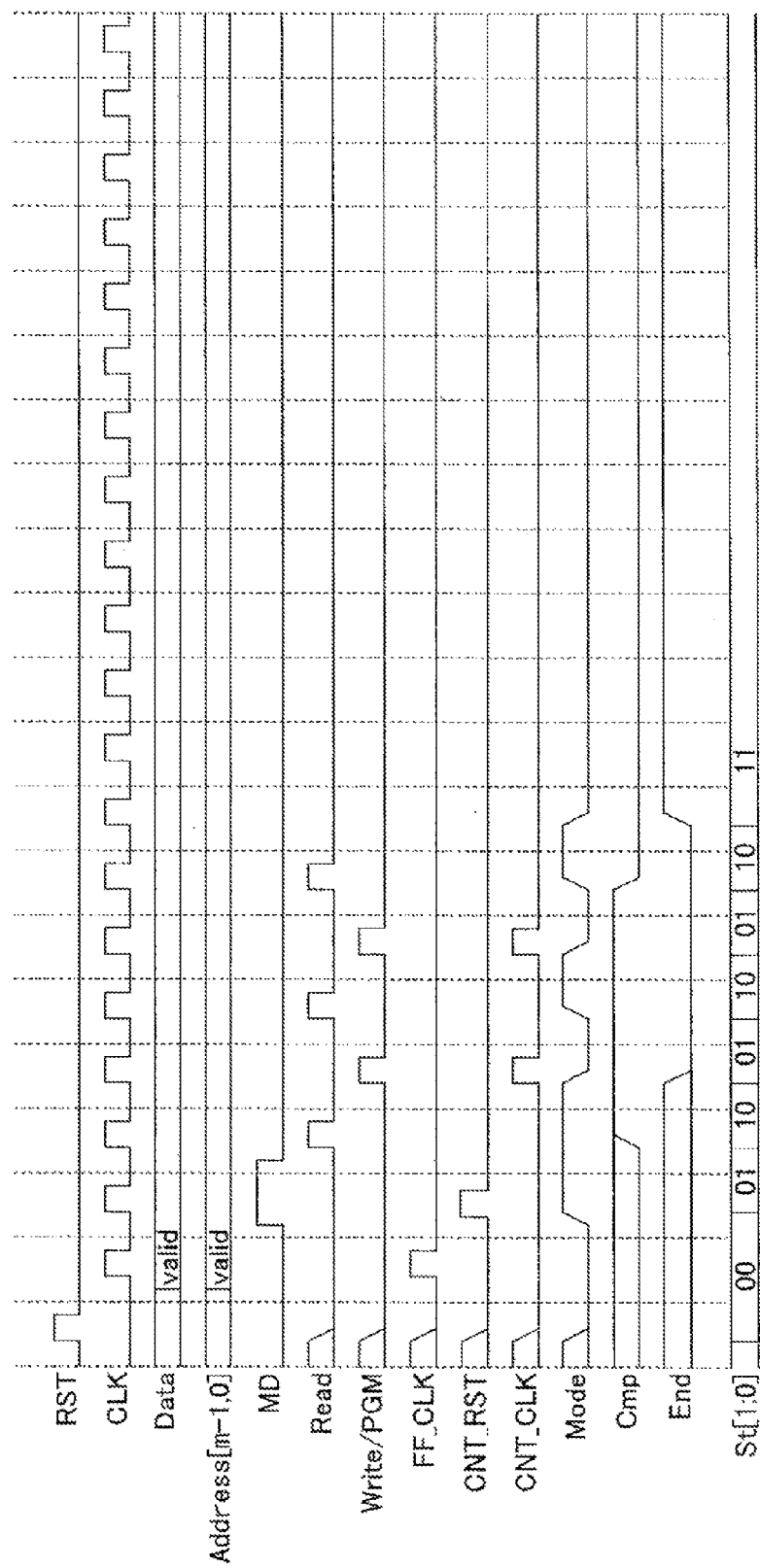
FIG. 9 is a diagram for explaining an example of a writing operation of the writing circuit according to a first embodiment.

Next, an example of the operations of the writing circuit 12 is explained using a timing chart. FIG. 9 is a diagram for explaining an example of a writing operation of the writing circuit according to a first embodiment. It is noted that in FIG. 9 it is assumed that the value of the writing data is "1". Further, FIG. 9 illustrates an example in which the writing (breakdown of the oxide film) is successfully implemented when the PGM signal is applied twice.

First of all, the RST signal is applied to the state machine 121 by the LSI tester 20. The state machine 121 initializes the stored value to "s00" in response to the application of the RST signal. In other words, the writing circuit 12 becomes in the set status.

Next, the LSI tester 20 starts to apply the CLK signal. Further, the LSI tester validates the values of the Data signal and the Address signal. In other words, the Data signal indicates the value of the writing signal and the value of the Address signal indicates the address to which the writing is to be performed. Further, the LSI tester 20 makes the value of the MD signal "0".

In response to the application of the CLK signal, the St signal whose value is "s00" is input to the control circuit 122. The control circuit 122 applies the FF_CLK signal based on the fact that the value of the St signal is "s00" and the value of the MD signal is "0". In response to the application of the FF_CLK signal, the comparison data storing part 123 stores the value (i.e., the writing data) indicated by the Data signal. Further, the setting on data generating part 124 generates the setting data whose value is the same as the writing data stored in the comparison data storing part 123.

Next, the LSI tester 20 makes the value of the MD signal "1". In response to the fact that the value of the MD signal becomes "1", the control circuit 122 applies the CNT_RST signal and makes the value of the Mode signal "1". In response to the application of the CNT_RST signal, the counter 126 initializes the number of writings to "0".

In response to an input of the CLK signal after the value of the Mode signal becomes "1", the state machine 121 changes the stored value to "s01" based on a combination of the value "1" of the Mode signal and the current stored value "s00". In response to an input of the next clock signal, the state machine 121 outputs the St signal whose value is "s01" to the control circuit 122. The control circuit 122 applies the Read signal based on the fact that the value of the St signal is "s01". Further, the control circuit 122 remains the value of the Mode signal at "1". In response to the application of the Read signal, within the data register 115 is stored (read) the value in the memory cell in the OTP memory array 111 corresponding to the address indicated by the Address signal. At this stage, since writing is not performed to any memory cells, "0" is output.

In response to an input of the next CLK signal, the state machine 121 changes the stored value to "s10" based on a combination of the value "1" of the Mode signal and the current stored value "s01". Further, in response to an input of the next CLK signal, the state machine 121 outputs the St signal whose value is "s10" to the control circuit 122. Further, the comparator 125 outputs the Cmp signal which indicates "1" as an exclusive OR between the value ("0") stored in the data register 115 and the value ("1") stored in the comparison data storing part 123. The setting data generating part 124 adopts the value of the Cmp signal as setting data. However, if the writing data is 1 bit, even though the setting data is updated by the value of the Cmp signal, the value of the setting data is the same as the writing data. It is noted that at this stage the number of writings does not reach the upper limit (5 times, for example) and thus the value of the Max signal output from the counter 126 is "0".

The control circuit 122 applies the Write signal and the PGM signal based on the fact that the value of the St signal is "s10", the value of the Cmp signal is "1" and the value of the Max signal is "0". In response to the application of the Write signal, the setting data generated by the setting data generating part 124 is set in the data register 115. Further, in response to the application of the PGM signal, writing with respect to the writing data stored in the data register 115 is performed to the memory cell in the OTP memory array 111 corresponding to the address indicated by the Address signal. However, here, it is assumed that the writing ends in failure. In other words, it is assumed that the oxide film associated with the corresponding memory cell is not broken-down.

Further, the control circuit 122 applies the CNT_CLK signal. In response to application of the CNT_CLK signal, the counter 126 adds 1 to the number of writing. Further, the control circuit 122 makes the value of the Mode signal "0". The state machine 121 changes the stored value to "s01" based on a combination of the value "0" of the Mode signal and the current stored value "s10".

In response to an input of the next CLK signal, the state machine 121 outputs the St signal whose value is "s01" to the control circuit 122. The control circuit 122 applies the Read signal based on the fact that the value of the St signal is "s01". Further, the control circuit 122 makes the value of the Mode signal "1". In response to the application of the Read signal, within the data register 115 is stored (read) the value in the memory cell in the OTP memory array 111 corresponding to the address indicated by the Address signal. Since the writing to the corresponding memory cell ends in failure at the time of the previous writing, "0" is read.

In response to an input of the next CLK signal, the state machine 121 changes the stored value to "s10" based on a combination of the value "1" of the Mode signal and the current stored value "s01". Next, in response to an input of the next CLK signal, the state machine 121 outputs the St signal whose value is "s10" to the control circuit 122. Further, the comparator 125 outputs the Cmp signal which indicates "1" as an exclusive OR between the value ("0") stored in the data register 115 and the value ("1") stored in the comparison data storing part 123. The setting data generating part 124 adopts the value of the Cmp signal as setting data. It is noted that at this stage the number of writings does not reach the upper limit and thus the value of the Max signal output from the counter 126 is "0".

The control circuit 122 applies the Write signal and the PGM signal based on the fact that the value of the St signal is "s10", the value of the Cmp signal is "1" and the value of the Max signal is "0". In response to the application of the Write signal, the setting data generated by the setting data generating part 124 is set in the data register 115. Further, in response to the application of the PGM signal, writing with respect to the writing data stored in the data register 115 is performed to the on memory cell in the OTP memory array 111 corresponding to the address indicated by the Address signal. Here, it is assumed that the writing is success. In other words, it is assumed that the oxide film associated with the corresponding memory cell is broken-down.

Further, the control circuit 122 applies the CNT_CLK signal. In response to application of the CNT_CLK signal, the counter 126 adds 1 to the number of writing. Further, the control circuit 122 makes the value of the Mode signal "0". The state machine 121 changes the stored value to "s01" based on a combination of the value "0" of the Mode signal and the current stored value "s10".

In response to an input of the next CLK signal, the state machine 121 outputs the St signal whose value is "s01" to the control circuit 122. The control circuit 122 applies the Read signal based on the fact that the value of the St signal is "s01". Further, the control circuit 122 makes the value of the Mode signal "1". In response to the application of the Read signal, within the data register 115 is stored (read) the value in the memory cell in the OTP memory array 111 corresponding to the address indicated by the Address signal. Since the writing to the corresponding memory cell is successfully performed at the time of the previous writing, "1" is read.

In response to an input of the next CLK signal, the state machine 121 changes the stored value to "s10" based on a combination of the value "1" of the Mode signal and the current stored value "s01". Next, in response to an input of the next CLK signal, the state machine 121 outputs the St signal whose value is "s10" to the control circuit 122. Further, the comparator 125 outputs the Cmp signal which indicates "0" as an exclusive OR between the value ("1") stored in the data register 115 and the value ("1") stored in the comparison data storing part 123.

The control circuit 122 remains the value of the Mode signal at "1" based on the fact that the value of the St signal is "s10". As a result of this, in response to an input of the CLK signal, the state machine 121 changes the stored value to "s11" based on a combination of the value "1" of the Mode signal and the current stored value "s10". The state machine 121 outputs the St signal whose value is "s11" to the control circuit 122. The control circuit 122 makes the END signal "1" based on the fact that the value of the St signal is "s11". In other words, the control circuit 122 ends the writing of the writing data.

Figure 10:
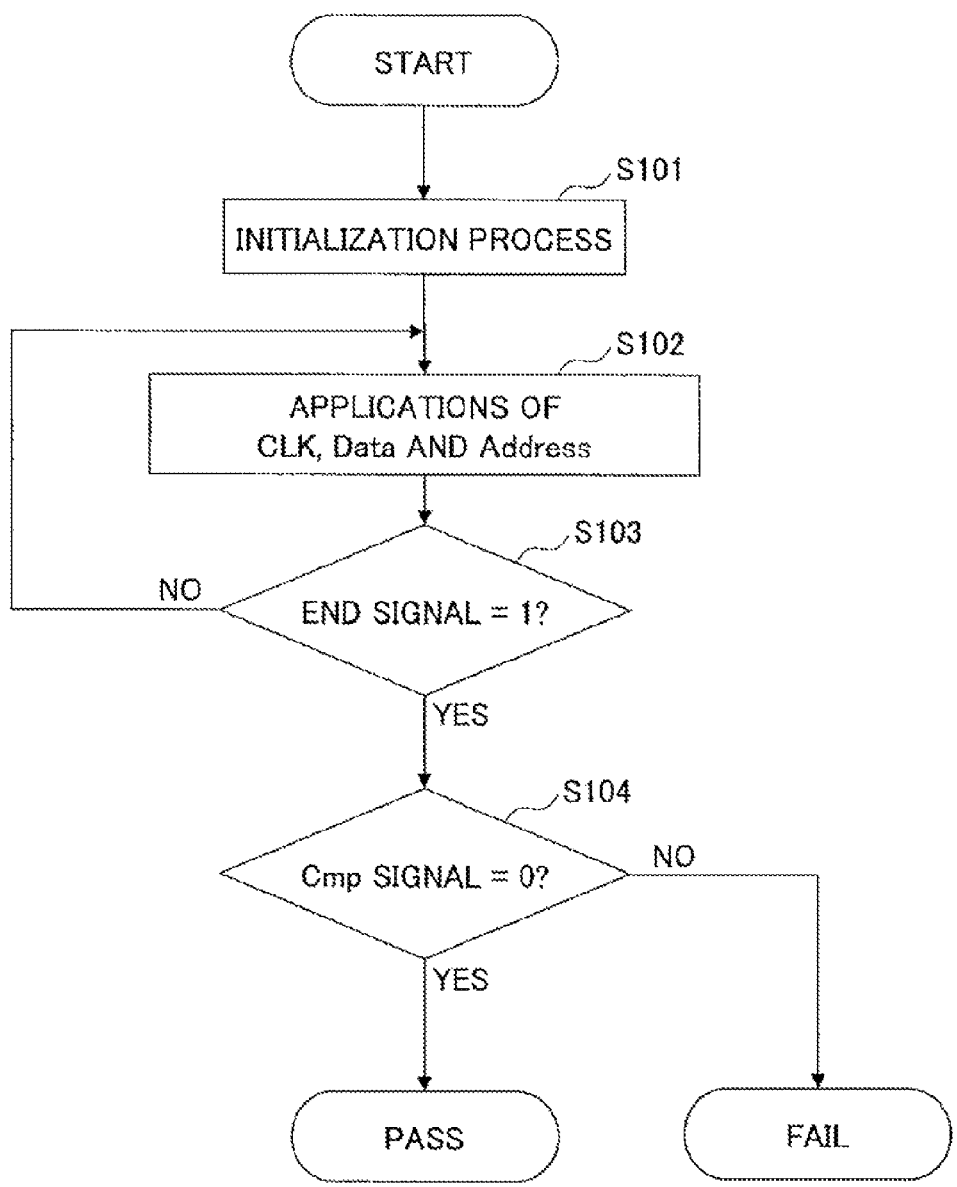
FIG. 10 is a flowchart for explaining an example of a procedure of a process which the LSI tester executes.

Since the writing circuit 12 performs the operations as described above, the LSI tester 20 (the CPU 21) according to the present embodiment may execute a process illustrated in FIG. 10, for example.

FIG. 10 is a flowchart for explaining an example of a procedure of a process which the LSI tester executes.

In step S101, the CPU 21 executes an initialization process. In the initialization process, the application of the RST signal is performed. Then, the CPU 21 starts to apply the CLK signal to the LSI 10 and validates the Data signal and the Address signal (S102). The applications of the CLK signal, the Data signal and the Address signal are continued until the value of the END signal input from the LSI 10 becomes "1". It is noted that the CPU 21 applies the MD signal at a predetermined timing after the CPU 21 starts to apply the CLK signal, the Data signal and the Address signal. This is performed to change the status of the writing circuit 12 from the set status on to the read status. The application of the MD signal is ended after a lapse of a predetermined time.

If the CPU 21 detects that the value of the END signal input from the LSI 10 becomes "1" (YES in S103), the CPU 21 determines whether the value of the Cmp signal input from the LSI 10 is "0" (S104). If the value of the Cmp is "0" (YES in S104), the CPU 21 determines that the writing of the writing data is successful (PASS). On the other hand, if the value of the Cmp is "1" (NO in S104), the CPU 21 determines that the writing of the writing data ends in failure (FAIL).

As described above, according to the first embodiment, the writing circuit 12 embedded in the LSI 10 performs the writing of the writing data and ascertains whether the writing is successful or not. Thus, it is not necessary for the LSI tester 20 to perform switching between a program in which a pattern sequence for writing is installed and a program in which a pattern sequence for reading is installed. In other words, a program for executing the pattern sequence illustrated in FIG. 10 may be executed. As a result of this, it becomes possible to shorten the time required for the writing of the writing data to the OTP macro 11. Thus, it is possible to reduce the time of usage (occupation time) of the LSI tester 20 and it can be anticipated to reduce the manufacturing cost of the LSI 10.

Further, monitoring by an operator is necessary in the case of performing the switching between a program in which a pattern sequence for writing is installed and a program in which a pattern sequence for reading is installed. To the contrary, according to the present embodiment, such switching is not necessary and thus it can be anticipated to reduce labor costs.

Next, a second embodiment is described. In the second embodiment, points different from the first embodiment are described. Thus, points not described in particular in the second embodiment may be the same as the first embodiment.

Figure 11:
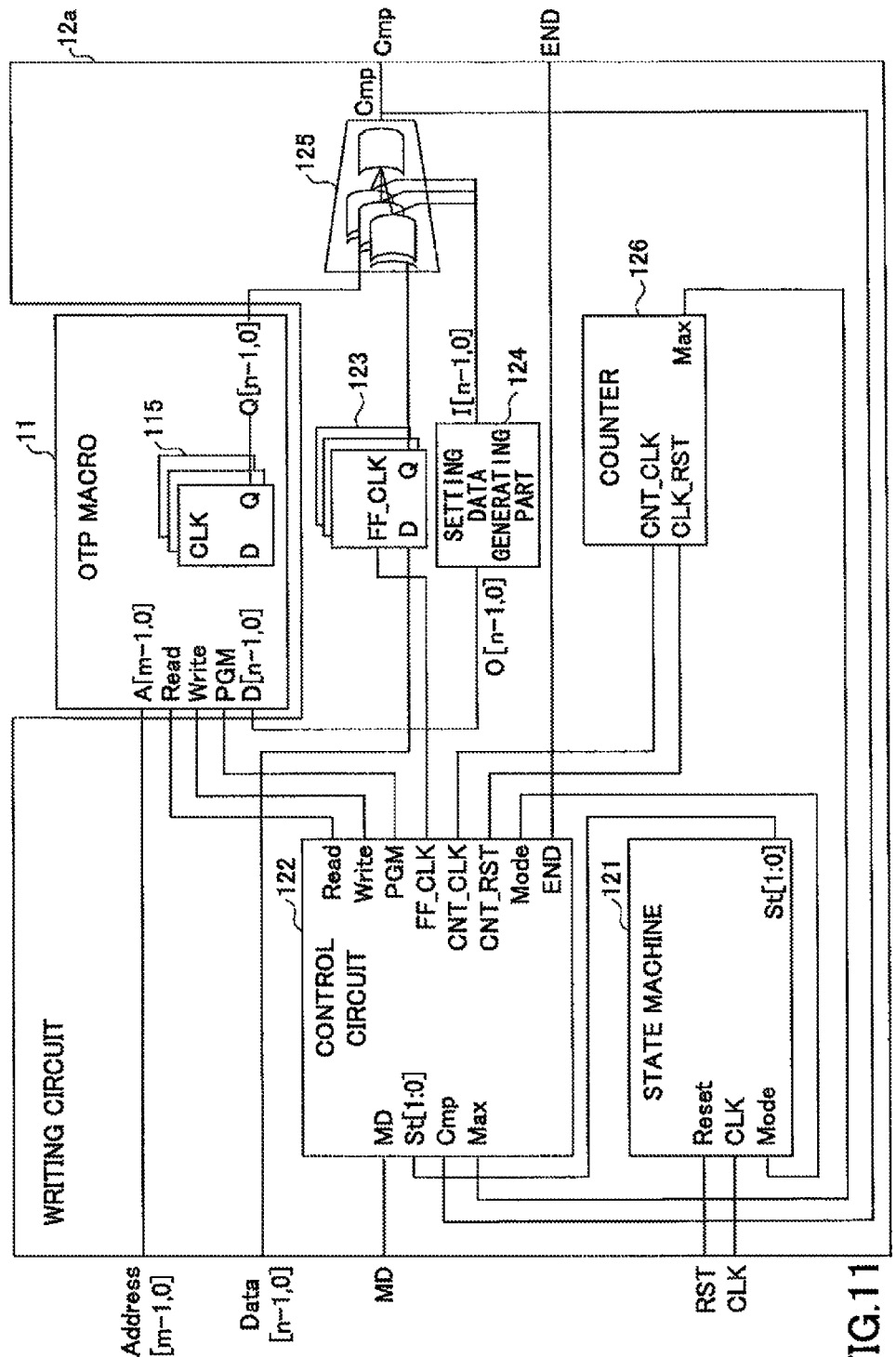
FIG. 11 is a diagram for illustrating an example of a configuration of a writing circuit according to a second embodiment.

FIG. 11 is a diagram for illustrating an example of a configuration of a writing circuit according to a second embodiment. According to the second embodiment, a case in which a word in an OTP memory array is several bits is assumed. In the present embodiment, the "word" indicates a unit of a information amount corresponding to an address. Since a word is several bits, the writing data is several bits (here, 3 bits, for the sake of convenience). Thus, a data register 115 of an OTP macro 11 includes three flip-flops so that it can store data of three bits.

Further, in the writing circuit 12a a comparison data storing part 123, a comparator 125 and a setting data generating part 124 are extended. Specifically, the comparison data storing part 123 includes three flip-flops so that it can store the writing data of three bits.

The comparator 125 includes three XOR gates corresponding to the respective bits and an OR gate so that it can compare the data of three bits. In other words, the XOR gate corresponding to the Nth bit calculates an exclusive OR between the data stored in the Nth flip-flop of the comparison data storing part 123 and the data stored in the Nth flip-flop of the data register 115. The calculation result is output to the OR gate. The OR gate calculates a logical sum of the calculation result of three exclusive ORs and outputs a Cmp signal which indicates the calculation result. If the data to be compared matches with the corresponding data with respect to all the bits (i.e., if the writing is success), the calculation result of the three exclusive ORs are "0", respectively. Thus, the on value of the Cmp signal, which is the logical sum of the three exclusive ORs, is "0". On the other hand, if the data to be compared does not match with the corresponding data with respect to any one of the bits (i.e., if the writing ends in failure), the exclusive OR associated with the corresponding bit is "1". Thus, the value of the Cmp signal, which is the logical sum of the three exclusive ORs including "1", is "1".

The setting data generating part 124 generates setting data of three bits based on the writing data of three bits stored in the comparison data storing part 123. According to the present embodiment, the least significant bit (rightmost bit) is referred to as a "$0^{th}$ bit". Thus, the respective bits of three bits are referred to as a $0^{th}$ bit, a $1^{st}$ bit, a $2^{nd}$ bit, respectively.

The setting data generating part 124 generates setting data such that a $0^{th}$ bit of the setting data corresponds to the value of the $0^{th}$ bit of the writing data. With respect to the Nth bit after the $1^{st}$ bit, the setting data generating part 124 makes the value of the Nth bit "0" if the logical sum of the values of the respective bits (or a bit) before the Nth bit of the writing data is "1". The setting data generating part 124 makes the value of the Nth bit of the setting data correspond to the value of the $N^{th}$ bit of the writing data if the logical sum of the values of the respective bits before the Nth bit of the writing data is "0".

Specifically, in the case of N=1, the bit before the Nth bit is only the $0^{th}$ bit. Thus, the value of the $1^{st}$ bit of the setting data is "0" if the value of the $0^{th}$ bit of the writing data is "1" and the value of the $1^{st}$ bit of the writing data if the value of the $0^{th}$ bit of the writing data is "0". In the case of N=2, the bits before the Nth bit are the $0^{th}$ bit and the $1^{st}$ bit. Thus, the value of the on $2^{nd}$ bit of the setting data is "0" if the logical sum of the values of the $0^{th}$ bit and the $1^{st}$ bit of the writing data is "1" and the value of the $2^{nd}$ bit of the writing data if the logical sum of the values of the $0^{th}$ bit and the $1^{st}$ bit of the writing data is "0". It is noted that this is also applicable for a case where the writing data is more than three bits.

As a result of this, the setting data generated by the setting data generating part 124 is data of three bits in which "1" is included in only one bit at most. Specifically, the setting data generated in the case where the writing data is "101" is explained. In this case, the value of the $0^{th}$ bit of the setting data corresponds to the value of the $0^{th}$ bit of the writing data and thus is "1". The value of the $1^{st}$ bit of the setting data is "0" because the value of the $0^{th}$ bit of the writing data is "1". The value of the $2^{nd}$ bit of the setting data is "0" because the logical sum of the values of the $0^{th}$ bit and the $1^{st}$ bit of the writing data is "1". Thus, the setting data is "001". Further, the setting data generated in the case where the writing data is "111" is explained. In this case, the value of the $0^{th}$ bit of the setting data corresponds to the $0^{th}$ bit of the writing data and thus is "1". The value of the $1^{st}$ bit of the setting data is "0" because the value of the $0^{th}$ bit of the writing data is "1". The value of the $2^{nd}$ bit of the setting data is "0" because the logical sum of the values of the $0^{th}$ bit and the $1^{st}$ bit of the writing data is "1". Thus, the setting data is "001".

In this way, the setting data includes "1" in only one bit at most. This is because in the OTP macro 11 the writing can be performed for only one bit at one time of the write status (i.e., every time when the Write signal and the PGM signal are applied once). In other words, this is because data permitted to be stored (set) in the data register 115 is data in which "1" is included in only one bit at most.

However, since the setting data has a limit that at most one bit can have the value of "1", it is not possible to write "1" of another bit to the OTP memory array 111. Therefore, in the read status after the first write status, the setting data generating part 124 performs the calculation with respect to data, in which the values output from the respective XOR gates of the comparator 125 are arranged in a bit order, as in the case with the calculation for the writing data stored in the comparison data storing part 123. The calculation result is used as the setting data in the read status after the first write status. In other words, from the second write status, the setting data based on the values output from the respective XOR gates of the comparator 125 is set in the data register 115.

In other words, the setting data may be generated by any other methods as long as the setting data is generated by allocating "1" to one of bits having a value of "1" of data and allocating "0" to other bits of the data wherein the data is the writing data stored in the comparison data storing part 123 or the data in which the values output from the respective XOR gates of the comparator 125 are arranged in a bit order.

Operations of the writing circuit 12a are described based on the foregoing. In the second embodiment, the logic of the control circuit 122 and the state machine 121 is the same as the first embodiment (FIG. 8). Here, the writing data is assumed to be "101". Thus, in the set status, in the comparison data storing part 123 is set as "101". The setting data generating part 124 generates the setting data "001" based on the writing data "101".

Then, after a transition to the read status, the control circuit 122 applies the Read signal. In response to the application of the Read signal, in the data register 115 is read the data stored in the memory cell group in the OTP memory array 111 associated with the word corresponding to the address indicated by the Address signal. If there is no writing so far, "000" is read. The comparator 125 compares the read data "000" with the writing data "101". Since the read data differs from the writing data, the Cmp signal indicating "1" is output from the comparator 125. Further, the calculation results of the exclusive OR on a bit basis are output from the respective XOR gates of the comparator 125 to the setting data generating part 124. The exclusive ORs between "000" and "101" on a bit basis are "101". The setting data generating part 124 generates the setting data "001" based on "101".

Then, after a transition to the write status, the control circuit 122 applies the Write signal and PGM signal. In response to the Write signal, in the data register 115 is set the setting data "001". Further, in response to the PGM signal, the writing of "1" is performed for the memory cell in the OTP memory array 111 which corresponds to $0^{th}$ bit of the word corresponding to the address indicated by the Address signal. Here, it is assumed that the writing is success.

Then, after a transition to the read status, in the data register 115 is read the data stored in the memory cell group in the OTP memory array 111 associated with the word corresponding to the address indicated by the Address signal. Here, "001" is read. The comparator 125 compares the read data "001" with the writing data "101". Since the read data differs from the writing data, the Cmp signal indicating "1" is output from the comparator on 125. Further, the calculation results of the exclusive OR on a bit basis are output from the respective XOR gates of the comparator 125 to the setting data generating part 124. The exclusive ORs between "001" and "101" on a bit basis are "100". The setting data generating part 124 generates the setting data "100" based on "100".

Then, after a transition to the write status, the control circuit 122 applies the Write signal and PGM signal. In response to the Write signal, in the data register 115 is set the setting data "100". Further, in response to the PGM signal, the writing of "1" is performed for the memory cell in the OTP memory array 111 which corresponds to the $2^{nd}$ bit of the word corresponding to the address indicated by the Address signal. Here, it is assumed that the writing is success.

Then, after a transition to the read status, in the data register 115 is read the data stored in the memory cell group in the OTP memory array 111 associated with the word corresponding to the address indicated by the Address signal. Here, "101" is read. The comparator 125 compares the read data "101" with the writing data "101". Since the read data matches with the writing data, the Cmp signal indicating "0" is output from the comparator 125.

Since the value of the Cmp signal becomes "0", the transition to the end status is performed, and the control circuit 122 applies the END signal. As a result of this, the writing of the writing data "101" is ended.

As described above, according to the second embodiment, the same effect as the first embodiment can be obtained in the case where the writing data is several bits.

It is noted that in the embodiments described above, in order to write the data with on respect to the several bits or several words, it is necessary for the Address signal and the Data signal to be input on a bit basis or on a word basis. However, the writing data of all the addresses (or all the words) may be stored in the writing circuit 12 (including the writing circuit 12a) in advance (at the initialization process in FIG. 10, for example). In this case, the writing data of all the addresses may be stored in the comparison data storing part 123 which is extended for these addresses. Alternatively, a SRAM (Static Random Access Memory) may be added to the writing circuit 12 so that the writing data of all the addresses is stored in the SRAM.

Further, if the number of the writing reaches the Max number, instead of the transition to the end status, writing of the bit for which the writing ends in failure may be performed to the redundant cell line 112. In this case, a new status (referred to as "redundant write status") which indicates the writing to the redundant cell line 112 may be defined, for example. If the redundant write status is defined, the number of the operation statuses becomes five. Thus, the state machine 121 may store the values indicating the respective statues with three bits. In the write status, if the value of the Comp signal is not "0" and the value of the Max signal is "1", the transition to the redundant write status may be performed.

It is noted that in the present embodiment, the comparison data storing part 123 is an example of storage. The control circuit 122 is an example of a controller. The Write signal and the PGM signals are an example of a first signal. The Read signal is an example of a second signal. The comparator 125 is an example of a controller. The counter 126 is an example of a counter. The setting data generating part 124 is an example of a generating part.

The present invention is disclosed with reference to the preferred embodiments. However, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A writing circuit comprising:
   storage to store writing data to be written to an OTP macro;
   a controller to apply a first signal that causes the OTP macro to execute writing of the writing data and apply a second signal that causes the OTP macro to execute reading of data stored in the OTP macro; and
   a comparator to compare the data read from the OTP macro in response to the second signal with the data stored in the storage and output a comparison result,
   wherein the controller ends a process associated with the writing data if the comparison result indicates a match, and applies the first and second signals again if the comparison result on indicates a mismatch.

2. The writing circuit of claim 1, further comprising:
   a counter count the number of applications of the first signal and provide a notification to the controller if the number reaches an upper limit,
   wherein the controller ends the process associated with the writing data if the comparison result indicates a match or in response to the notification.

3. The writing circuit of claim 1, further comprising:
   a data generator to generate data by allocating "1" to one of bits having a value of "1" of the writing data and allocating "0" to other bits of the writing data,
   wherein the controller applies the first signal with respect to the data generated by the data generator,
   the comparator outputs an exclusive OR between the data read from the OTP macro in response to the second signal and the data stored in the storage on a bit basis,
   the data generator generates data by allocating "1" to one of bits having a value of "1" of data in which the exclusive ORs on a bit basis are arranged in a bit order and allocating "0" to other bits of the data.

4. A semiconductor integrated circuit including the writing circuit of claim 1.

5. A writing method performed by a writing circuit, the writing method comprising:
   storing writing data in storage, the writing data to be written to an OTP macro;
   applying a first signal that causes the OTP macro to execute writing of the writing data;
   applying a second signal that causes the OTP macro to execute reading of data stored in the OTP macro;
   comparing the data read from the OTP macro in response to the second signal with the data stored in the storage; and
   ending a process associated with the writing data if a comparison result indicates a match, and applying the first and second signals again if the comparison result indicates a mismatch.

6. The writing method of claim 5, further comprising:
   counting the number of the applications of the first signal, and
   ending a process associated with the writing data includes ending the process associated with the writing data if the comparison result indicates a match or the number reaches an upper limit.

7. The writing method of claim 5, further comprising:
   generating data by allocating "1" to one of bits having a value of "1" of the writing data and allocating "0" to other bits of the writing data,
   applying the first signal includes applying the first signal with respect to the generated data;
   comparing includes outputting an exclusive OR between the data read from the OTP macro in response to the second signal and the data stored in the storage on a bit basis,
   generating data includes generating data by allocating "1" to one of bits having a value of "1" of data in which the exclusive ORs on a bit basis are arranged in a bit order and allocating "0" to other bits of the data.

* * * * *